United States Patent
Cannara et al.

(10) Patent No.: US 8,893,311 B2
(45) Date of Patent: Nov. 18, 2014

(54) THREE-DIMENSIONAL IMAGING AND MANIPULATION

(75) Inventors: Rachel Cannara, Adliswil (CH); Bernd W. Gotsmann, Horgen (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 1358 days.

(21) Appl. No.: 12/349,720

(22) Filed: Jan. 7, 2009

(65) Prior Publication Data

US 2010/0175156 A1    Jul. 8, 2010

(51) Int. Cl.
*G01Q 80/00* (2010.01)
*G03F 7/00* (2006.01)
*G01Q 20/04* (2010.01)
*B82Y 30/00* (2011.01)
*B82Y 40/00* (2011.01)
*B82Y 10/00* (2011.01)
*B82Y 35/00* (2011.01)

(52) U.S. Cl.
CPC ............... *G03F 7/0002* (2013.01); *B82Y 30/00* (2013.01); *B82Y 40/00* (2013.01); *B82Y 10/00* (2013.01); *G01Q 20/04* (2013.01); *B82Y 35/00* (2013.01)
USPC .............................................. 850/62; 850/63

(58) Field of Classification Search
USPC ................. 850/5, 7, 8, 12, 13, 52, 56, 59, 63; 73/104, 105
See application file for complete search history.

(56) References Cited

U.S. PATENT DOCUMENTS

| | | | | |
|---|---|---|---|---|
| 5,356,218 A | * | 10/1994 | Hopson et al. | 374/124 |
| 7,054,257 B2 | | 5/2006 | Binnig et al. | |
| 2004/0218507 A1 | * | 11/2004 | Binnig et al. | 369/154 |

OTHER PUBLICATIONS

Kim et al., "Nanotopical Imaging Using a Heated Atomic Force Microscope Probe" Sensors and Actuators A 136 (2007) pp. 95-103.*
A small introduction into Scanning Thermal Microscopy and Scanning Acoustic Microscopy.
Scanning Thermal Microscope Accessory Allows Nanoscale Thermal Imaging, A to Z of Nanotechnology.
Majumdar, Scanning Thermal Microscopy, Annu. Rev. Mater. Sci. 1999. 29:505-85.

* cited by examiner

*Primary Examiner* — Nicole Ippolito
(74) *Attorney, Agent, or Firm* — Ryan, Mason & Lewis, LLP

(57) ABSTRACT

A three-dimensional imaging and manipulation tool is provided. Techniques for creating a three-dimensional imaging and manipulation tool include combining high-resolution capability of a probe with three-dimensional imaging capability of a heater sensor. Also, techniques for positioning a nano-manipulation device relative to a surface are provided. The techniques include using a heater sensor for non-contact imaging, linking the heater sensor to the nano-manipulation device, and positioning the nano-manipulation relative device to a surface.

3 Claims, 12 Drawing Sheets

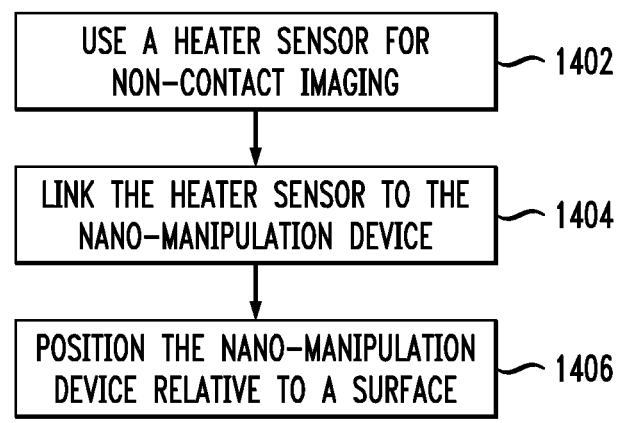

… … …

THREE-DIMENSIONAL IMAGING AND MANIPULATION

FIELD OF THE INVENTION

The present invention generally relates to probe-based technology, and, more particularly, to three-dimensional imaging and manipulation.

BACKGROUND OF THE INVENTION

Scanned probes are widely used for metrology, patterning and manipulation on the nanometer scale. For a number of applications, it is important that only the desired part of a surface or structure be exposed to the interacting probe because the probe may be changed or may change the structure in an undesired fashion. For example, in biological applications, samples can be extremely delicate and interactions with the probe may damage the sample.

Similarly, the absolute positioning of a probe with respect to a large, complicated sample can be challenging. One existing approach is to take large scale images recorded with the probe; however, with such an approach, tip endurance may be problematic. For example, in probe lithography, tip wear is an issue. Here, it is advantageous to minimize the interaction with the probing tip. Ideally, the tip should interact with the sample only in the regions that are supposed to be manipulated. The sample may have too much topography to allow large scale imaging with the probe, for example, when the application requires manipulation of a surface of a micro-electro-mechanical system (MEMS) device.

For absolute positioning, it is desirable to combine the high resolution imaging and/or patterning capability of the probe with an imaging technique for the larger scale, capable of imaging true three-dimensional (3-D) structures, meanwhile leaving the high resolution probe off-contact during imaging. As used herein, 3-D imaging refers to imaging surface topography where the magnitude of the topography in the normal direction (z-direction) is of similar magnitude as the lateral extend of the surface structures of interest. One existing approach includes the combination of a scanned probe device with an optical microscope. However, this approach is tedious, expensive, does not adequately image in 3-D and is restricted to some very specialized applications.

Additionally, existing approaches include atomic force microscopes (AFMs). Traditional AFM is a powerful tool for nano-scale imaging and manipulation, but, in existing approaches, it is limited in multi-scale resolution. Existing approaches include a lack of positional information out of contact, tip dimensional constraints, are time intensive and subject to tip wear and contamination. Furthermore, some existing approaches need an accompanying optical microscope for larger scale positioning.

SUMMARY OF THE INVENTION

Principles of the present invention provide a three-dimensional (3-D) imaging and manipulation tool. An exemplary method for creating a three-dimensional imaging and manipulation tool, according to one aspect of the invention, can include combining high-resolution capability of a probe with three-dimensional imaging capability of a heater sensor.

Also, an exemplary method for positioning a nano-manipulation device relative to a surface, according to one aspect of the invention, can include steps of using a heater sensor for non-contact imaging, linking the heater sensor to the nano-manipulation device, and positioning the nano-manipulation relative device to a surface.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 13 is a flow diagram illustrating techniques for creating a three-dimensional imaging and manipulation tool, according to an embodiment of the present invention; and FIG. 14 is a flow diagram illustrating techniques for positioning a nano-manipulation device relative to a surface, according to an embodiment of the present invention.

DETAILED DESCRIPTION OF PREFERRED EMBODIMENTS

Principles of the present invention include a three-dimensional (3-D) imaging and manipulation tool with multi-scale resolution. One or more embodiments of the invention include combining the high resolution capability of a probe (for example, an AFM or scanning tunneling probe tip) with the 3-D coarse imaging capability of a heater sensor. Such a heater sensor can be, for example, included or attached to the probe tip. By way of example, a silicon micro-heater structure can have about one micron lateral resolution and below 10 nanometers (nm) normal resolution and can be easily combined with an AFM tip.

An exemplary device described herein can include decoupling the imaging and manipulation modes (that is, the integrated heater in the cantilever is separate from the probe tip or other metrology or manipulation tool). One or more embodiments of the invention can also operate in an off-contact mode (that is, no contact is made between the heater and the surface) and can have a resolution that depends on the size of the integrated heater, which can be varied independently from the probe tip dimensions.

Figure 1:
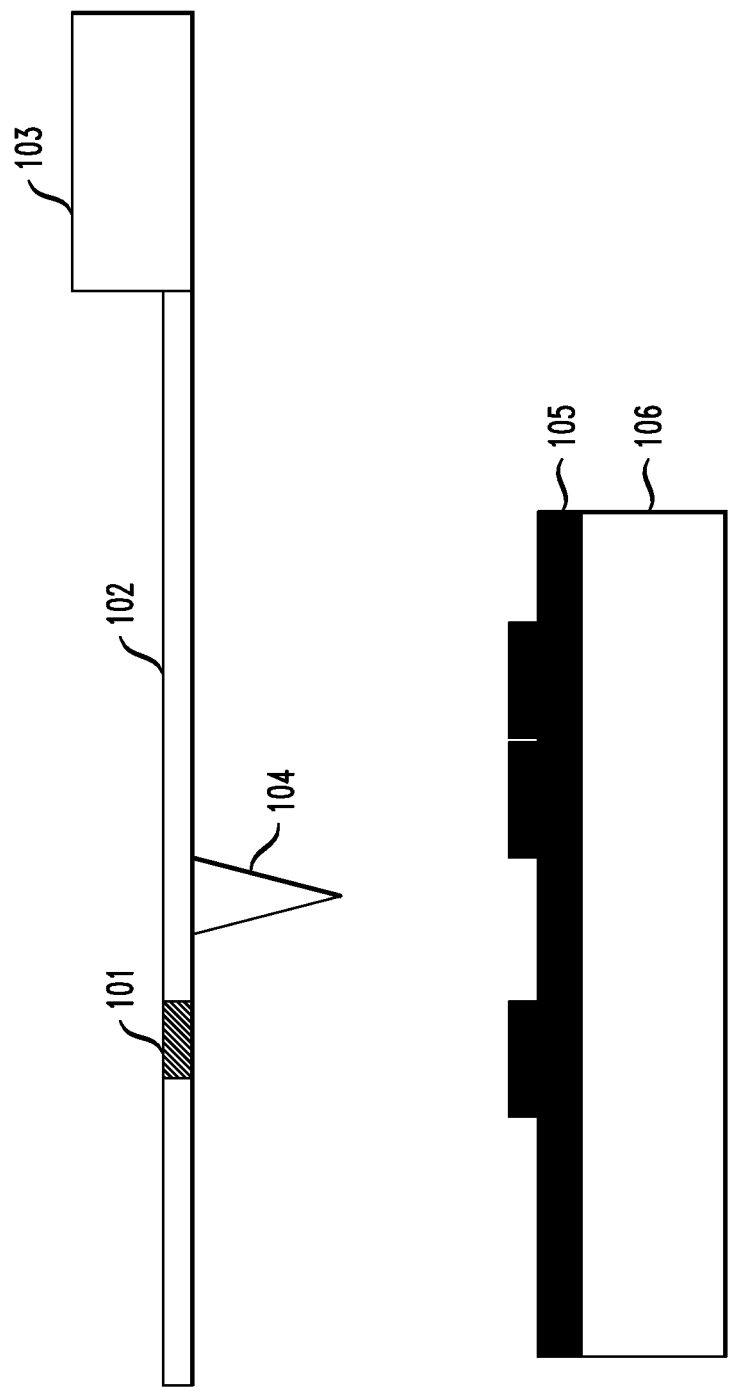
FIG. 1 is a diagram illustrating a 3-D imaging and manipulation tool, according to an embodiment of the present invention.

FIG. 1 is a diagram illustrating a 3-D imaging and manipulation tool, according to an embodiment of the present invention. By way of illustration, FIG. 1 depicts a heater sensor 101, a cantilever 102, cantilever support 103, a probe tip 104, a sample 105 and sample support (to be moved with respect to cantilever support) 106. As depicted in FIG. 1, one or more embodiments of the invention integrate micro-heaters onto AFM cantilevers and can include multi-scale resolution.

A current is applied to heat the micro-heater to a certain temperature (for example, 100-200 degree Celsius). The temperature of the micro-heater is a function of how close the heater is to the sample surface. As the sample-heater separation increases, the heater temperature increases and vice versa. The electrical resistance of the micro-heater is a function of the heater temperature. Hence, the sample-heater separation can be measured as a change in the electrical resistance or a resulting change in the current for the constant bias voltage.

While the tip is in contact with the sample surface, this tool can image surfaces with a resolution given by the tip dimensions. As the tip probes the sample surface the sample-heater separation changes as a function of the sample topography. However, the tool can also image the sample surface off-contact. However, off-contact resolution would be defined by the heater dimensions. Depending on the changes in the sample topography, the sample-heater separation (or tip-sample separation) changes which can be measured as a change in the current.

As such, when out of contact, resolution is defined by the (micro-scale) heater and, when in contact, resolution is defined by the (nano-scale) tip. The techniques described herein enable faster micro-scale positioning, and off-contact imaging avoids tip wear and contamination.

In addition, one or more embodiments of the invention can include nano-scale heater dimensions for nano-scale resolution, as well as multiple integrated heaters dedicated for resolving multi-scale features (for example, an array of heaters). Furthermore, an exemplary device, such as one described herein, can include non-imaging type probes for nano-manipulation with the heater as the imaging component.

Figure 2:
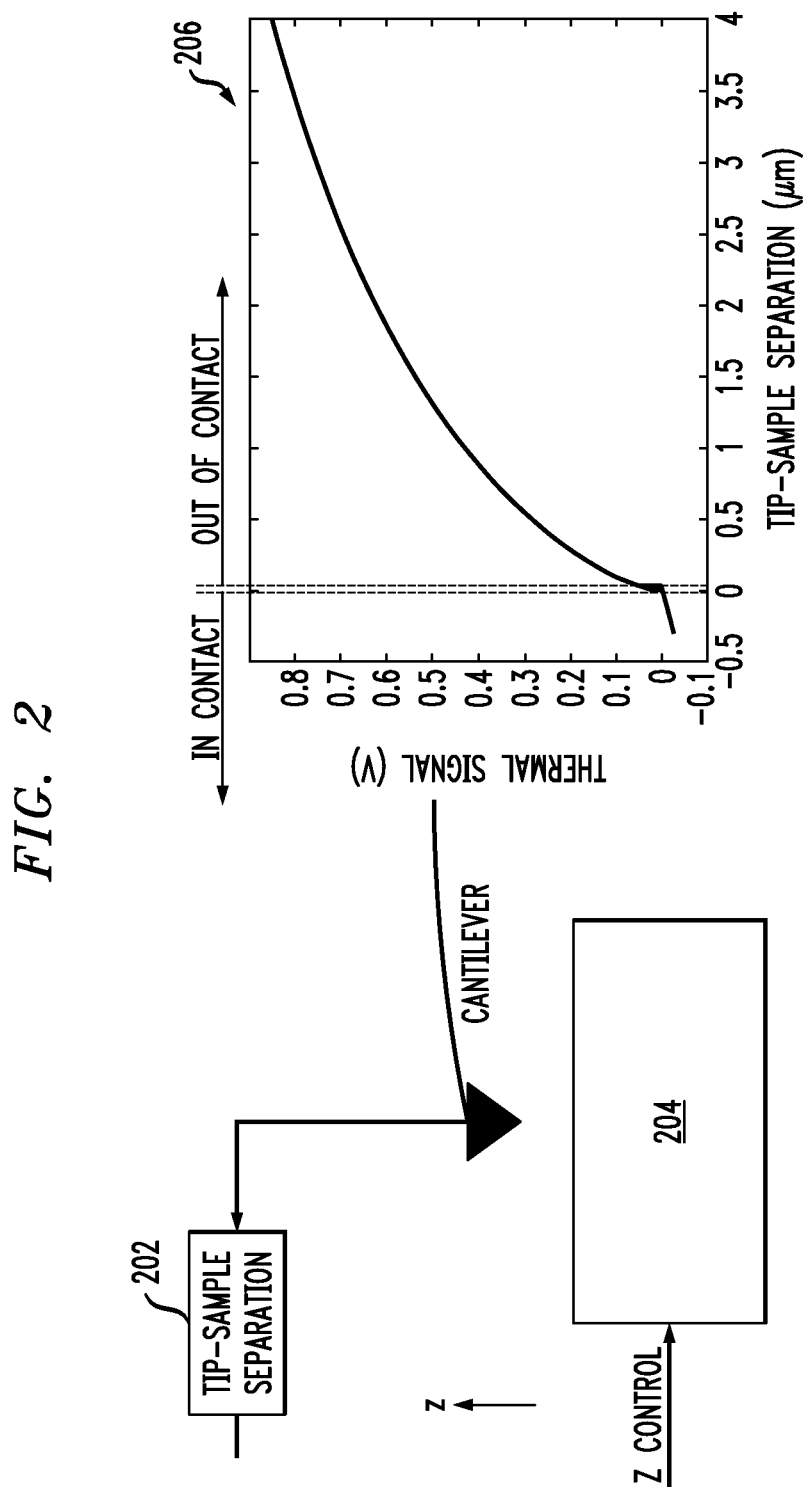
FIG. 2 is a diagram illustrating calibration of the tip-sample separation (tss), according to an embodiment of the present invention.

FIG. 2 is a diagram illustrating calibration of the tip-sample separation (tss), according to an embodiment of the present invention. By way of illustration, FIG. 2 depicts a measurement 202 of the separation between the cantilever tip and sample 204. This tip-sample separation (tss) is determined by z-position control of either the sample or cantilever base.

Also, as depicted on the right side of FIG. 2, the micro-heater's electrical resistance variation (thermal signal) is determined as a function of the change in tss in graph 206.

Figure 3:
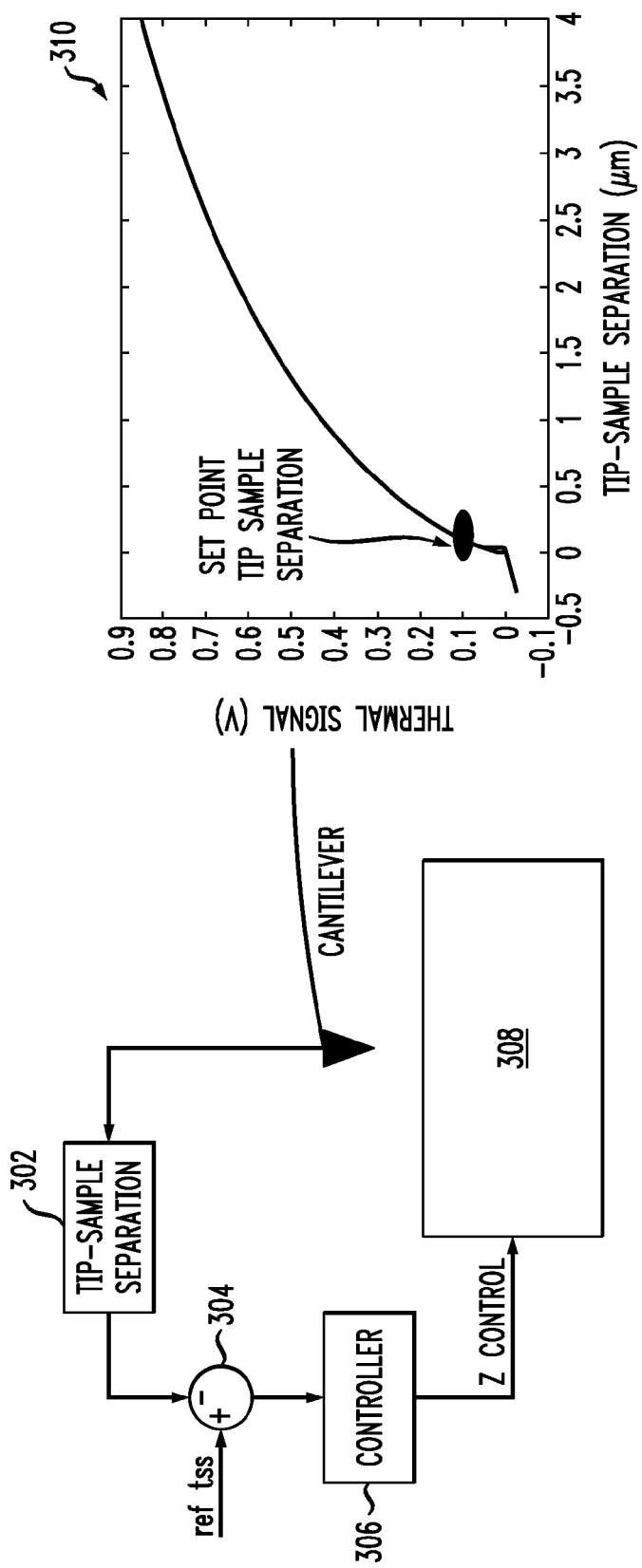
FIG. 3 is a diagram illustrating regulating on a constant tip-sample separation (tss) using a thermal signal, according to an embodiment of the present invention.

FIG. 3 is a diagram illustrating regulating on a constant tss using the thermal signal, according to an embodiment of the present invention. By way of illustration, FIG. 3 depicts a tss measurement 302, a reference or set-point tss 304, a z-position controller 306, a sample and sample positioning stage 308 and a tss graph 310, indicating an example set-point tss. One or more embodiments of the invention can regulate on a fixed tss using z-piezo and/or electrostatic actuation.

Figure 4:
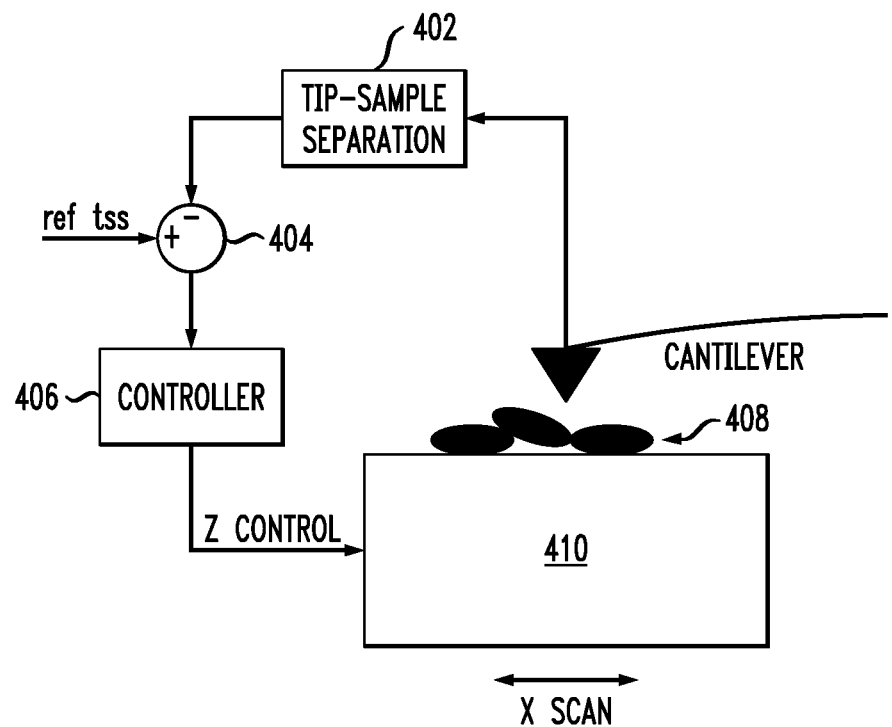
FIG. 4 is a diagram illustrating hovering on the sample surface, according to an embodiment of the present invention.

FIG. 4 is a diagram illustrating hovering on the sample surface, according to an embodiment of the present invention. By way of illustration, FIG. 4 depicts a tss measurement 402 of the thermal signal, a reference tss (or set-point) 404, a z-position controller 406, objects on the surface 408 and a sample stage and/or sample 410. As depicted in FIG. 4, one can image the sample surface while hovering on top of it. One or more embodiments of the invention can monitor the micro-heater resistance variation and/or monitor the control signal to the z-piezo.

Figure 5:
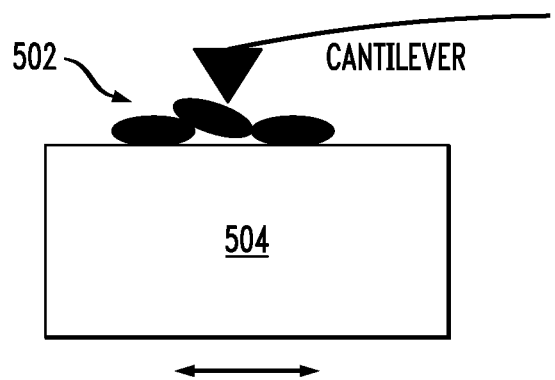
FIG. 5 is a diagram illustrating using the tip when nano-scale resolution is needed, according to an embodiment of the present invention.

FIG. 5 is a diagram illustrating using the tip when nano-scale resolution is needed, according to an embodiment of the present invention. By way of illustration, FIG. 5 depicts objects on the surface 502 and a sample stage and/or sample 504. One can make contact between the tip or nano-manipulation device and surface and use the tip or nano-manipulation device for nano-scale investigation or manipulation.

Figure 6:
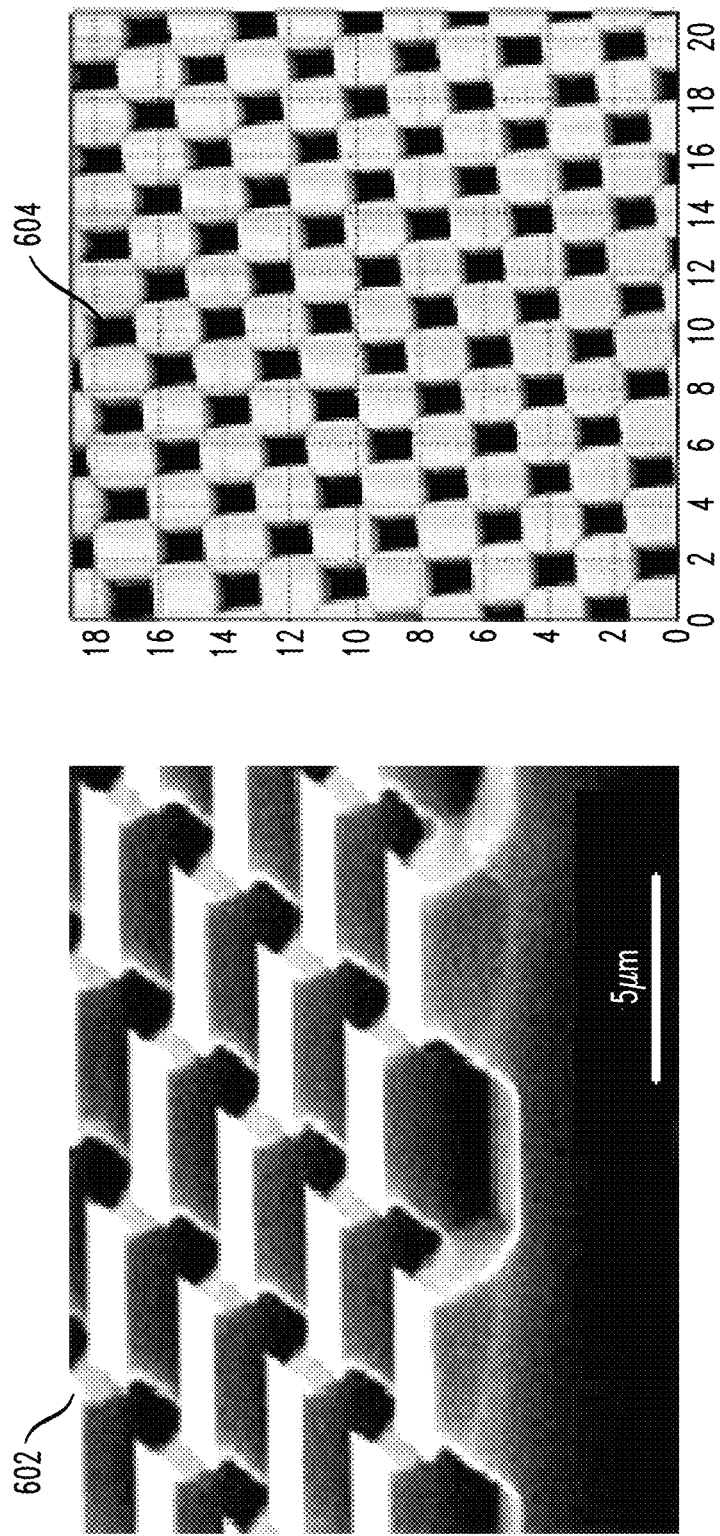
FIG. 6 is a diagram of an example of a silicon sample with significant topography suited for hover imaging, according to an embodiment of the present invention.

FIG. 6 is a diagram of an example of a silicon sample with significant topography suited for hover imaging, according to an embodiment of the present invention. FIG. 6 depicts an image of a silicon calibration sample taken using a scanning electron microscope (image 602) and an atomic force microscope (image 604). By way of example, a micro-fabricated silicon sample (as depicted in FIG. 6) can be used to demonstrate the lateral resolution of the techniques described herein. The trenches between islands of the sample (pitch: 10 microns, depth: ~2 microns) prevent imaging unless the tip height and aspect ratio are high enough (which, for example, is not the case for typical heated probes where the ability to transfer heat through the tip puts strong requirements on the choice of tip dimensions).

Figure 7:
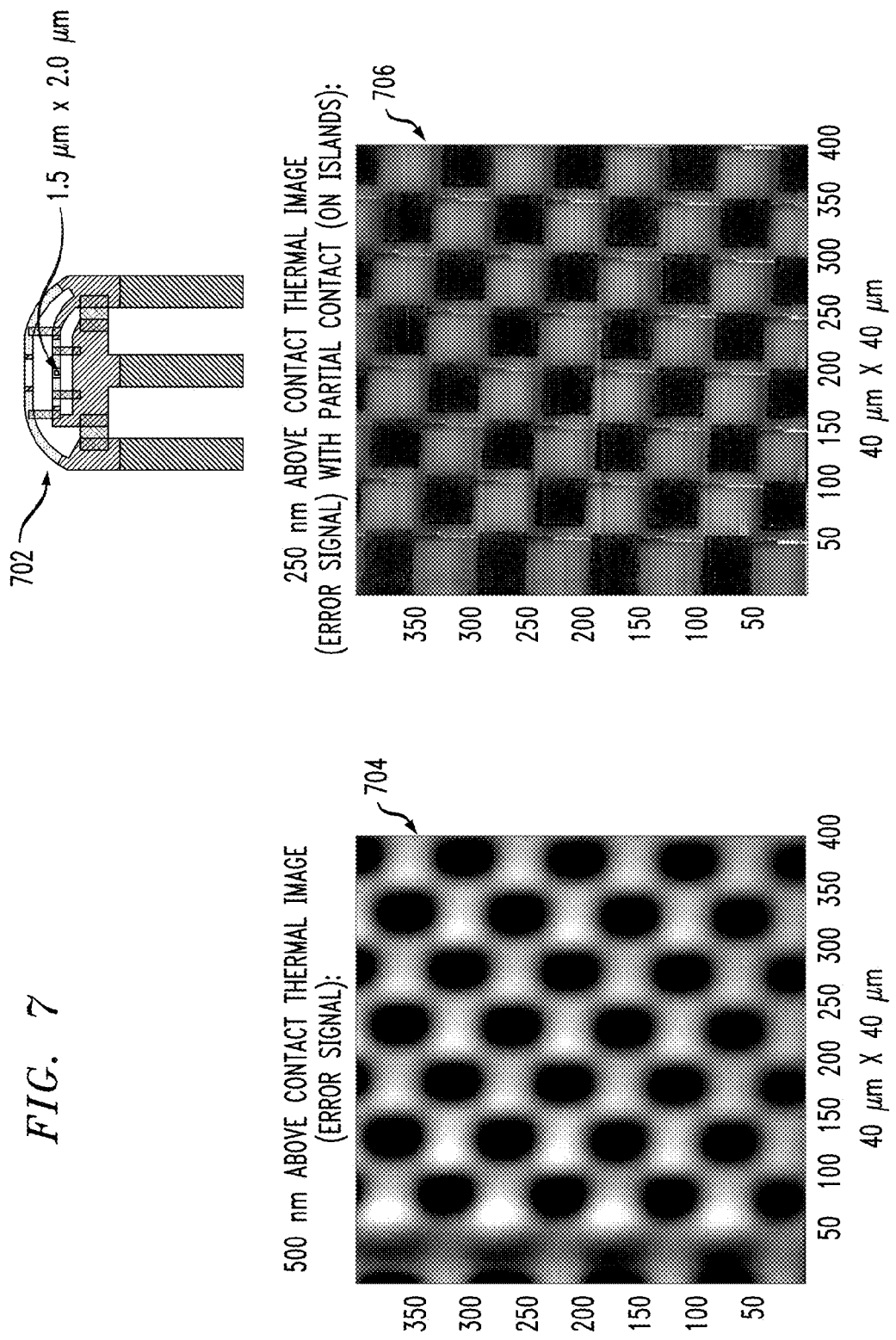
FIG. 7 is a diagram illustrating the hover image of the sample, according to an embodiment of the present invention.

FIG. 7 is a diagram illustrating the hover image of the sample (that is, image obtained of the silicon sample while hovering on top of the sample), according to an embodiment of the present invention. By way or illustration, FIG. 7 depicts a 3-D imaging and manipulation tool 702, an image 704 taken 500 nanometers (nm) above contact and an image 706 taken 250 nm above contact.

Additionally, as described herein, one or more embodiments of the invention include multi-scale metrology and manipulation. By way of example, the techniques described herein can include a manipulation event with absolute global positioning, as could be used for device fabrication. For instance, a 3-D image (for example, referred to herein as a HoverCraft image) can be taken of a structured surface with the probe tip out of contact with the sample. As an illustration, square structures on a surface can, for example, have a height of 30 nm, a width of 6 μm, and a pitch of 8 μm.

Also, a specific, predetermined square structure can be addressed using the hovering image with an absolute positioning accuracy estimated to be less than 100 nm for this particular heater probe. Further, a manipulation step can be performed (for example, by writing a pattern of thermo-mechanical indents with indent diameters of less than 10 nm).

Topographic images with nano-scale resolution can be recorded, for example, using standard imaging techniques of the AFM tip ("contact image"). As described herein, such images demonstrate the capability of one or more embodiments of the invention. However, one or more embodiments of the invention are able to avoid performing such imaging steps.

Figure 8:
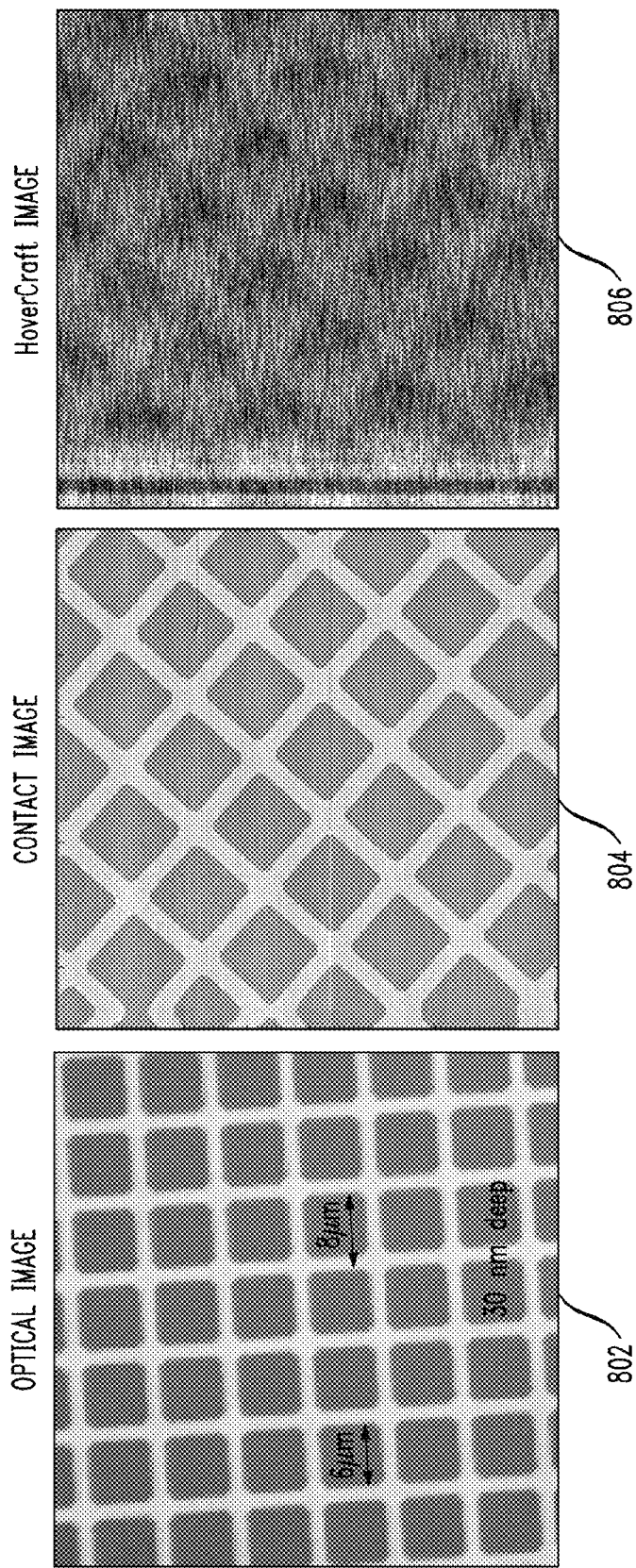
FIG. 8 is a diagram illustrating multi-scale metrology, according to an embodiment of the present invention.

FIG. 8 is a diagram illustrating multi-scale metrology and manipulation, according to an embodiment of the present invention. By way of illustration, FIG. 8 depicts an optical image 802, a contact image 804 and a HoverCraft image 806. The images depicted in FIG. 8 represent patterned polystyrene (PS) on silicon. Both the trenches and islands are coated with PS. FIG. 8 shows that one can resolve 30 nm trenches using a 1.5 μm×2.0 μm heater.

Figure 9:
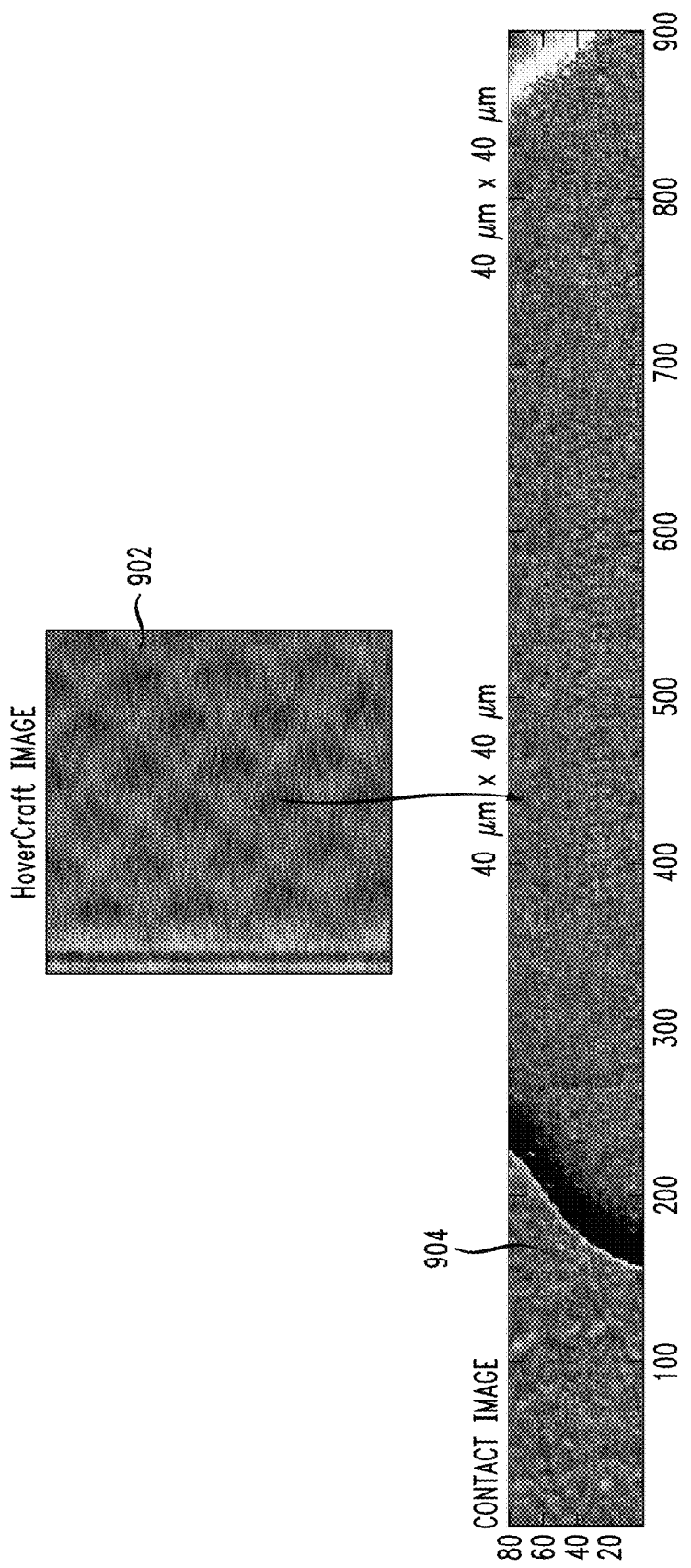
FIG. 9 is a diagram illustrating multi-scale metrology and manipulation, according to an embodiment of the present invention.

FIG. 9 is a diagram illustrating multi-scale metrology and manipulation, according to an embodiment of the present invention. By way of illustration, FIG. 9 includes a Hover-Craft image 902 and a contact image 904 depicting nano-scale indentation on an island selected specifically for the manipulation operation. FIG. 9 demonstrates that the resolution of the HoverCraft image is sufficient for locating a single island upon which to perform, for example, higher resolution imaging or manipulation operations.

Figure 10:
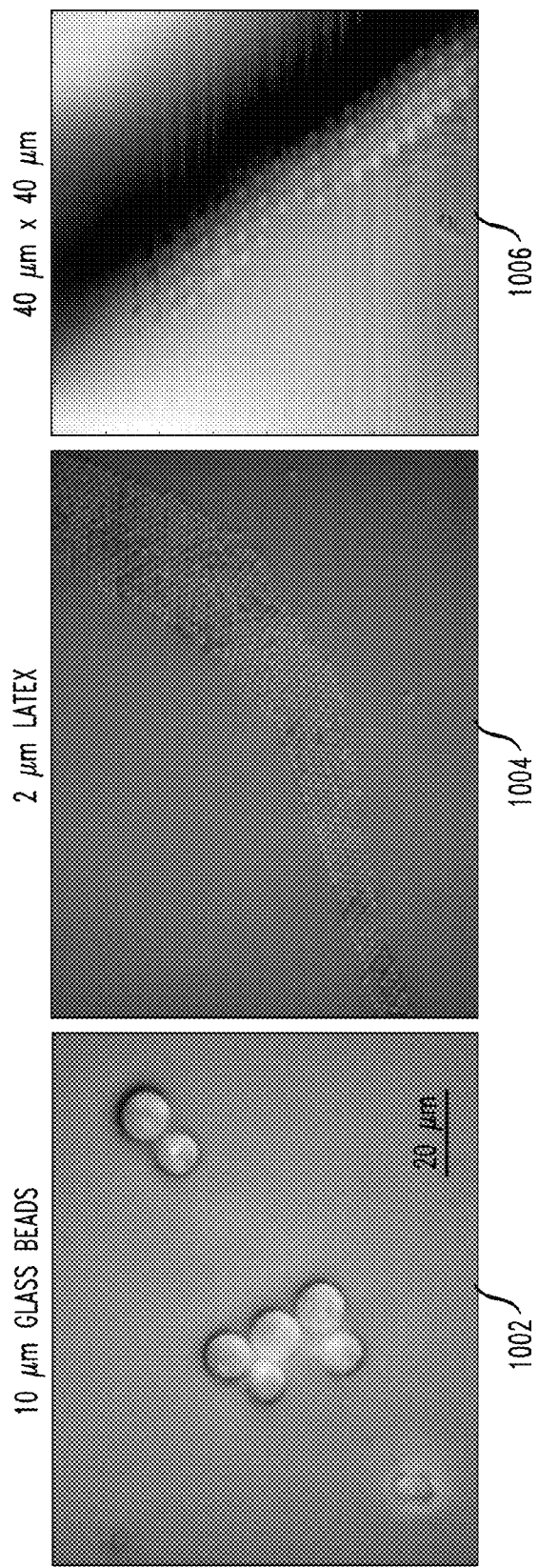
FIG. 10 is a diagram illustrating applications of a 3-D imaging and manipulation tool, according to an embodiment of the present invention.

FIG. 10 is a diagram illustrating applications of a 3-D imaging and manipulation tool, according to an embodiment of the present invention. By way of illustration, FIG. 10 depicts 10 μm glass beads 1002, and 2 μm latex beads 1004 and 1006 (smaller scale). As illustrated in FIG. 10, one or more embodiments of the invention can be used, for example, in multi-scale imaging, nano-manipulation and nano-robotics, as well as directed assembly. Tall features may be imaged despite the short length of a probe tip shaft or use of an alternative nano-scale probe or manipulation device.

Figure 11:
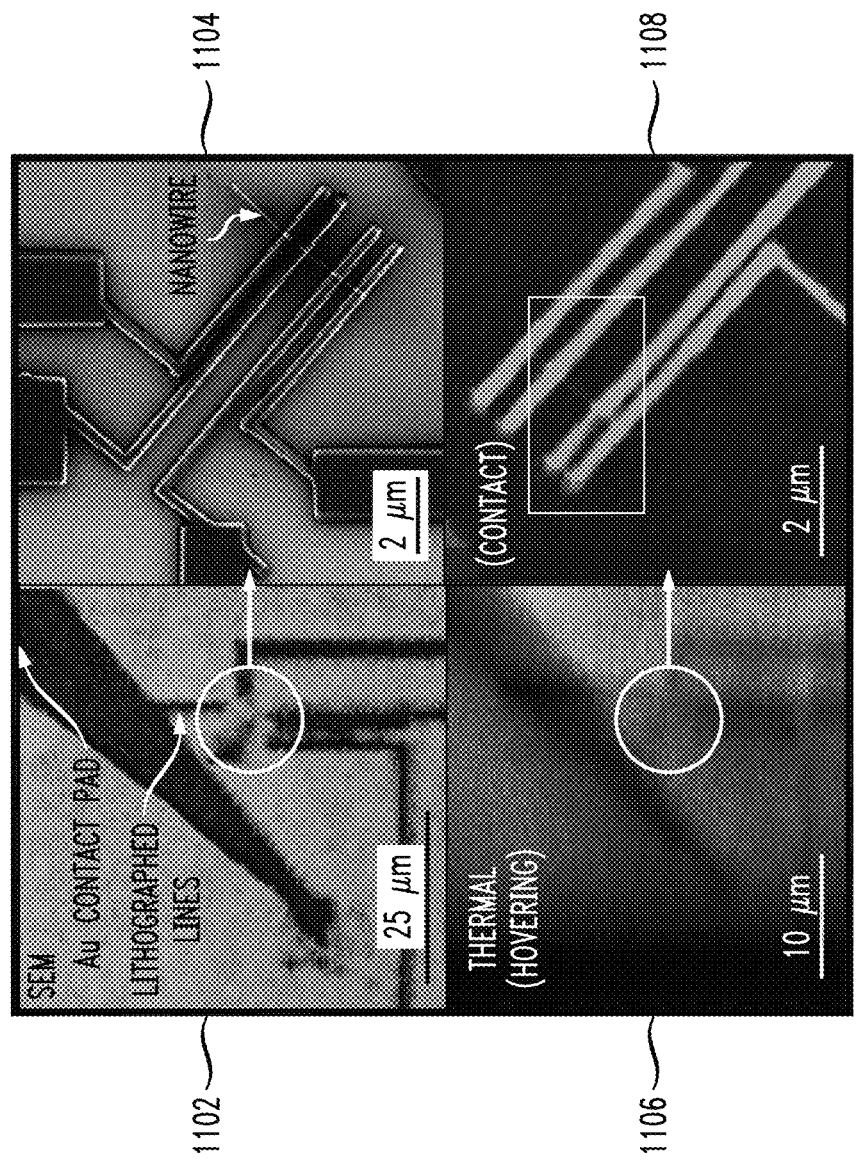
FIG. 11 is a diagram illustrating applications of a 3-D imaging and manipulation tool, according to an embodiment of the present invention.

FIG. 11 is a diagram illustrating applications of a 3-D imaging and manipulation tool, according to an embodiment of the present invention. By way of illustration, FIG. 11 depicts a scanning electron micrograph image 1102 of a silicon nano-wire attached to gold electrodes. A close-up view is shown in 1104. The HoverCraft image of this structure is shown in 1106. Using this image, the silicon nano-wire can be located and then imaged with high resolution using the probe in contact. This is shown in 1108. One or more embodiments of the invention can be used in micro-fabrication as well as lithography. Irregular features may be located and imaged.

Figure 12:
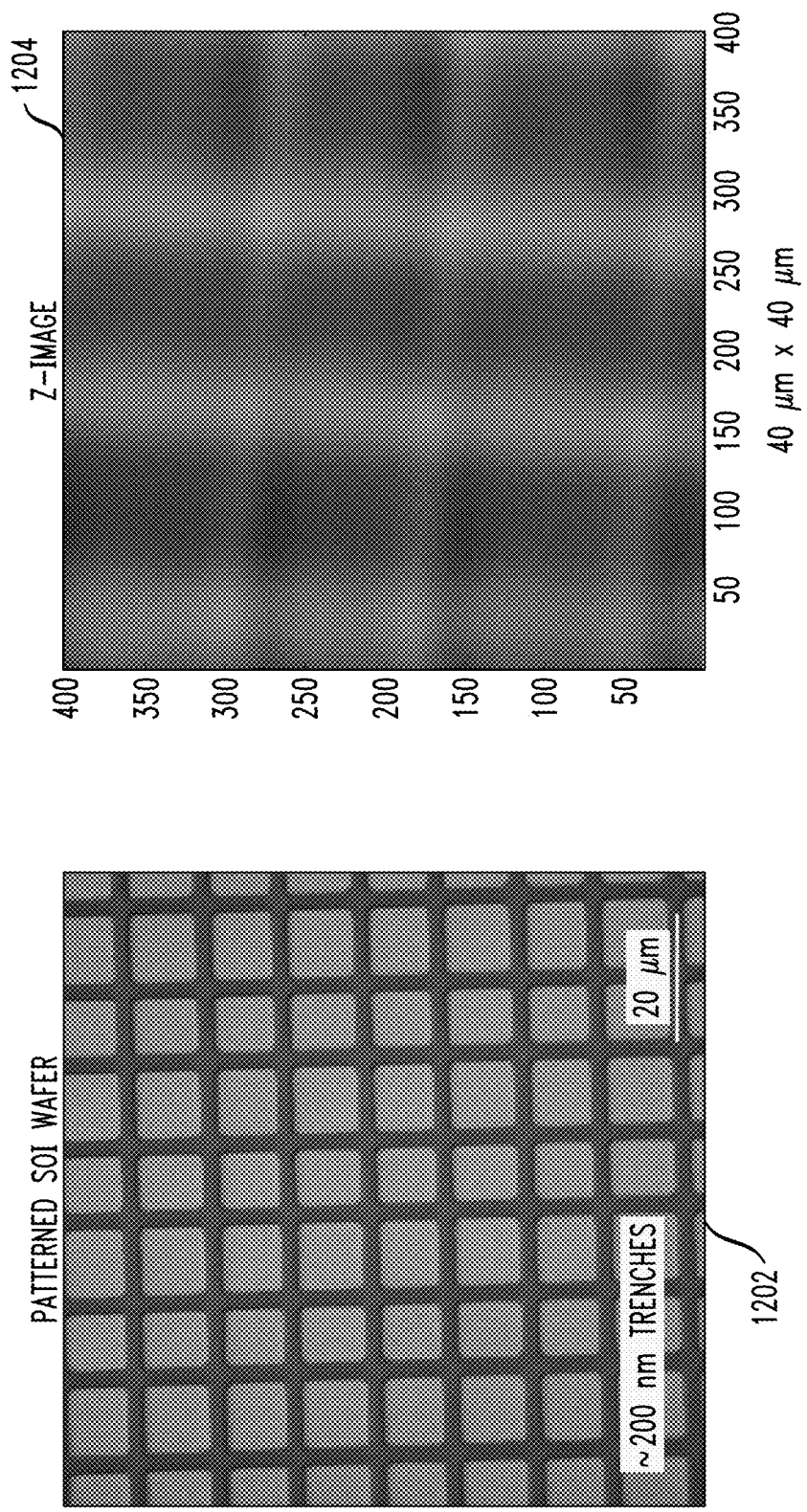
FIG. 12 is a diagram illustrating applications of a 3-D imaging and manipulation tool, according to an embodiment of the present invention.

FIG. 12 is a diagram illustrating applications of a 3-D imaging and manipulation tool, according to an embodiment of the present invention. By way of illustration, FIG. 12 depicts a patterned silicon-on-insulator (SOI) wafer 1202 and a z-position image 1204. As described herein, one or more embodiments of the invention include combining topography and thermal imaging, which can include, for example the study of thermal transport and a thermal conductivity mismatch.

Additionally, as described herein, one or more embodiments of the invention include three-dimensional imaging and manipulation tool that includes a heater sensor, wherein the heater sensor comprises non-contact imaging capability, and wherein, while imaging, a spatial heat confinement of the heater sensor defines lateral resolution of a surface. By way of example, such a tool can also include probes that scan a polymer medium with indentations. The probes can be pressed against the medium, falling into any indentations when moved across it. The deflection of the probe can be measured by a heater (that can be, for example, attached to the probe cantilever) which measures the variations in height between the cantilever and the medium. In one or more embodiments of the invention, the tip itself is heated by a current in order to write indentations into the medium.

FIG. 13 is a flow diagram illustrating techniques for creating a three-dimensional imaging and manipulation tool, according to an embodiment of the present invention. Step 1302 includes combining the high-resolution capability of a probe with the three-dimensional imaging (and non-contact imaging) capability of a heater sensor. The heater sensor can be included in a probe tip apex and/or be attached to a probe tip. Also, the heater sensor can be integrated into and/or be attached to a cantilever. Additionally, the tool can have a resolution and size that depends on the size of the heater sensor.

In one or more embodiments of the invention, the probe can be capable of addressing and/or imaging a surface with a lateral resolution of better than 100 nanometers, and the heater sensor can be capable of imaging a surface at a resolution of better than 10 microns.

The size of the heater sensor can vary and be chosen independently from dimensions of the probe. In one or more embodiments of the invention, the size of the heater sensor can be chosen independently from dimensions of the probe to attain lateral resolution capability of 100 nanometers to 10 microns. In addition, the tool can include a resolution that depends on size of the heater sensor (for example, nano-scale heater dimensions for nano-scale resolution). In one or more embodiments of the invention, the heater sensor can include a heater dimension of less than 100 nanometers.

The techniques depicted in FIG. 13 can also include integrating micro-heaters into cantilevers, enabling multi-scale resolution capability, as well as enabling multi-scale metrology capability. Furthermore, one or more embodiments of the invention can include combining non-imaging type probes for nano-manipulation with a heater as an imaging component.

FIG. 14 is a flow diagram illustrating techniques for positioning (for example, absolute positioning) a nano-manipulation device relative to a surface, according to an embodiment of the present invention. Step 1402 includes using a heater sensor for non-contact imaging. Using a heater sensor for non-contact imaging can include avoiding contact of the nano-manipulation device during three-dimensional (3-D) imaging. Step 1404 includes linking the heater sensor to the nano-manipulation device. Step 1406 includes positioning the nano-manipulation device relative to a surface. The nano-manipulation device can include, for example, a probe tip.

At least one embodiment of the invention may provide one or more beneficial effects, including, for example, decoupling the imaging and manipulation modes.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for positioning a nano-manipulation device relative to a surface, comprising the steps of:
   using a heater sensor for non-contact imaging;
   linking the heater sensor to the nano-manipulation device; and
   positioning the nano-manipulation device relative to a surface.

2. The method of claim 1, wherein the nano-manipulation device comprises a probe tip.

3. The method of claim 1, wherein using a heater sensor for non-contact imaging comprises avoiding contact of the nano-manipulation device during three-dimensional imaging.

* * * * *